Aug. 4, 1970 D. O. HANSEN ET AL 3,523,189

LIGHT-SENSITIVE CIRCUIT IN WHICH THE EFFECTIVE
LOAD OF A PHOTOTRANSISTOR IS BOOTSTRAPPED
Filed May 23, 1968

David O. Hansen
Neal L. Roy
*INVENTORS*

BY [signature]

ATTORNEY

United States Patent Office 3,523,189
Patented Aug. 4, 1970

3,523,189

LIGHT-SENSITIVE CIRCUIT IN WHICH THE EFFECTIVE LOAD OF A PHOTOTRANSISTOR IS BOOTSTRAPPED

David O. Hansen, Westminster, and Neal L. Roy, Redondo Beach, Calif., assignors to TRW Inc., Redondo Beach, Calif., a corporation of Ohio Filed May 23, 1968, Ser. No. 731,457
Int. Cl. H01j *39/12*
U.S. Cl. 250—211 12 Claims

ABSTRACT OF THE DISCLOSURE

A solid-state circuit responsive to relatively low-level light flashes while still providing a fast response. To this end the load impedance of the phototransistor is bootstrapped to make it appear large, thereby to provide a high gain. This is effected by a feedback connection between an output circuit of a transistor and the load. On the other hand, the effective capacitance is reduced so that the time constant of the circuit remains small to provide fast response.

BACKGROUND OF THE INVENTION

This invention relates generally to light-sensitive electronic circuits, and particularly relates to a phototransistor circuit providing fast response to low-level light flashes.

The circuit of the present invention offers particular advantages for amplifying light scintillations of low intensity, while still providing a fast response. In general it is difficult to obtain fast response while detecting low light levels. The reason for this is that the response time of a solid state circuit including a light sensor is limited by the RC time of the load or output network. In order to improve the amplification, the load resistance should be increased, which of course also increases the time constant. Accordingly a compromise must normally be made between the size of the load resistance and the desired response time.

It is accordingly an object of the present invention to provide a light-sensitive solid-state circuit which combines a fast response time with a high gain for low-amplitude light scintillations.

Another object of the present invention is to utilize a bootstrapped transistor circuit including a phototransistor which permits to increase substantially the effective size of the load resistance while maintaining the time constant at a level below that of the current rise and fall times of the phototransistor.

A further object of the present invention is to provide a light-sensitive circuit of the type described which includes means for peaking the response of the circuit at a predetermined frequency.

SUMMARY OF THE INVENTION

In accordance with the present invention there is provided a light-sensitive circuit permitting a fast response time at minimum light levels. This circuit includes both a phototransistor and a transistor, the transistor having its base connected to the emitter of the phototransistor. A first and a second resistor are connected in series between the emitter of the phototransistor and a point of fixed potential such as ground. The phototransistor is biased into operating conditions by a third resistor and a suitable battery connected to the collector.

In order to obtain the proper bootstrapping there is provided a first feedback connection between the emitter of the transistor and the collector of the phototransistor. This feedback connection may include a capacitor or a suitable constant voltage device, such, for example, as a Zener diode. There is also provided a second feedback connection between the emitter of the transistor and the junction point of the first two resistors.

Finally the transistor is biased into optimum operating conditions. To this end a fourth resistor is connected between the emitter of the transistor and another suitable battery.

As a result of the feedback connections the effective load resistance of the phototransistor represented by the first resistor is multiplied by $\alpha/(1-\alpha)$, where $\alpha$ is the voltage gain of the transistor connected as an emitter follower. At the same time the time constant of the circuit which is determined by the load resistance and the distributed capacitance thereacross may still be made small compared to the current rise and fall times of the phototransistor.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing.

DESCRIPTION OF THE PREFERRED EMBODIMENTS

Figure 1:
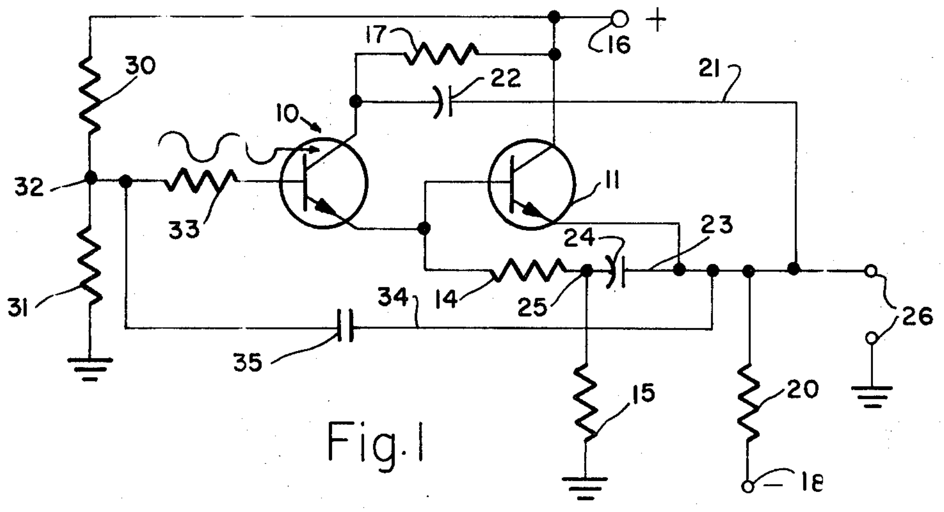
FIG. 1 is a circuit diagram of a solid-state light-sensitive circuit embodying the present invention.

Referring now to the drawing wherein like elements are designated by the same reference characters, and particularly to FIG. 1, there is illustrated a light-sensitive circuit embodying the invention. The circuit of FIG. 1 includes a phototransistor 10 and a transistor 11. Both transistors 10 and 11 may be of the n-p-n type as illustrated. The base of the transistor 11 is connected to the emitter of the phototransistor 10. A resistor 14 and a resistor 15 are connected serially between the emitter of phototransistor 10 and ground. In particular, the resistor 14 may be considered the load resistor for the phototransistor. The collector of the phototransistor 10 is connected to a source 16 of positive voltage through a bias resistor 17.

The collector of the transistor 11 is directly connected to the positive voltage point 16. Its emitter is connected to a point 18 to which a negative voltage source may be connected through a resistor 20. Accordingly the resistor 20 controls the bias condition for the transistor 11 by controlling the current flow through the emitter and collector.

Further in accordance with the present invention there is provided a first feedback conncetion 21 between the emitter of transistor 11 and the collector of phototransistor 10. Preferably a capacitor 22 is connected in this feedback connection. Similarly a second feedback connection 23 is provided between the emitter of transistor 11 and the junction point 25 of the resistors 14 and 15. Preferably, again, a capacitor 24 is connected in the feedback connection 23. The first feedback connection 21 is optional and may be entirely omitted along with the capacitor 22. The capacitor 22 serves the purpose to bootstrap any capacitance which may appear between the collector and base of the phototransistor 10. Accordingly if this bootstrapping is not desired or needed, the feedback connection 21 may be omitted. Furthermore, as will be more fully explained hereinafter, capacitors 22 and 24 are optional and may be omitted.

The output signal may be obtained from output terminals 26, one of which is connected to the emitter of transistor 11 and the other is grounded as shown. Accordingly it will be apparent that the transistor 11 is connected as an emitter follower.

Figure 3:
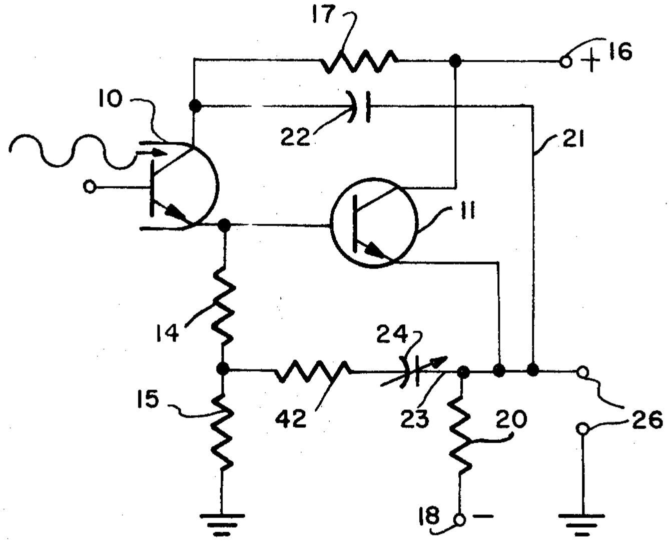
FIG. 3 is a circuit diagram of an alternative embodiment of the light-sensitive circuit of the invention permitting high-frequency peaking.

It is also feasible to provide a bias network for the base of phototransistor 10. This serves the purpose to bias the phototransistor into optimum sensitivity. However, it should be realized that it is also feasible to keep the base of phototransistor 10 floating as shown in FIG. 3, which will be subsequently explained. Accordingly a voltage divider network may be provided between the positive terminal 16 and ground. This voltage divider consists of two resistors 30 and 31 connected in series. Their junction point 32 may be connected to the base of phototransistor 10 by a resistor 33. Furthermore a feedback connection 34 may be provided between the emitter of transistor 11 and the junction point 32. This feedback connection may include a capacitor 35. This serves the purpose to unload the base of the phototransistor.

The circuit of FIG. 1 operates as follows: When light impinges on the phototransistor 10 the light current flows through the output load resistor 14 and then through resistor 15 to ground. As mentioned before, the transistor 11 is connected as an emitter follower and its output taken from the emitter of transistor 11 is returned to the junction point 25 by capacitor 24. Additionally the output is returned to the junction of the collector of phototransistor 10 and resistor 17 by capacitor 22. Preferably the capacitors 22 and 24 have such a value that they have substantially zero impedance at the operating frequency, that is, at the frequency of interest. Furthermore the resistors 15, 20 and 17, which are essentially connected in parallel, should have a sufficiently large resistance so that they do not load the output of the transistor 11.

Normally the bias current in the phototransistor consists only of the dark current, that is, the current in the absence of light which is normally very small. Maximum current gain of a transistor is typically obtained with a current on the order of a milliampere. Accordingly in order to promote optimum sensitivity of the phototransistor the bias network 30, 31 and 32 may be provided. This bias network permits to optimize the quiescent emitter current of the phototransistor.

Figure 2:
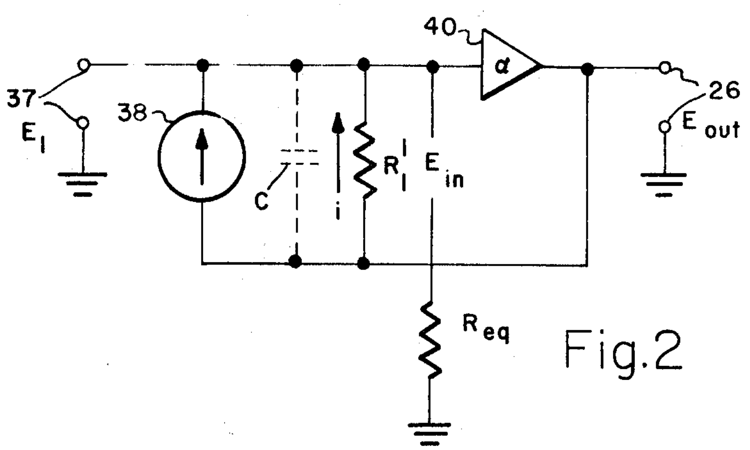
FIG. 2 is an alternating-current equivalent circuit diagram of a portion of the circuit of FIG. 1.

The operation of the circuit of FIG. 1 may be explained by means of FIG. 2, which is an alternating-current equivalent circuit. This includes a pair of input terminals 37 where an input voltage $E_1$ appears. A current source is shown schematically at 38, while the amplifier 40 represents the gain $\alpha$ of the emitter follower transistor 11. In this case the voltage gain $\alpha$ is that of an emitter follower, where $\alpha$ is defined as the ratio of an incremental change in emitter voltage to an incremental change in base voltage. The voltage $E_{out}$ appears at the output terminal 26.

Furthermore the resistor $R_1'$ represents the parallel combination of the load resistor 14 and the input resistance of the amplifier 11. The output impedance of the phototransistor 10 has been neglected since it is generally small compared to the resistance of $R_1'$. The resistance $R_{eq}$ represents a parallel combination of the resistors 15, 20 and 17. Finally, C is the distributed capacitance associated with the load resistor 14 such as interelectrode capacitance, wiring and the like.

From this circuit the following equations may be written to determine the relationship between input and output signals:

$$E_{out}=\alpha E_1 \quad (1)$$

This equation will be quite evident because the output voltage at the output terminals 26 is the input voltage at the input terminal 37 times the gain $\alpha$.

The following equation is also obtained from the equivalent circuit of FIG. 2.:

$$iR_1'=E_1-E_{out}=E_{in} \quad (2)$$

By combining the two equations, we obtain the following equation:

$$iR_1'=E_{out}\frac{1-\alpha}{\alpha} \quad (3)$$

This may be rewritten as follows:

$$E_{out}=iR_1'\frac{\alpha}{1-\alpha} \quad (4)$$

Acordingly the effective resistance $R_{eff}$ is as follows:

$$R_{eff}=R_1'\frac{\alpha}{1-\alpha} \quad (5)$$

It will be apparent from Equation 5 that the effective load resistance has been increased by a very large factor. In general $\alpha$ may be made to be at least 0.99 or larger so that the effective resistance may be on the order of 100 times the actual resistance. This, of course, is due to the bootstrapping of the load resistance by feedback connection 23.

On the other hand it should be realized that the capacitance C is similarly bootstrapped. This in turn reduces the effective capacitance in the same ratio as the resistance is increased. This may be visualized by the fact that less charge is required to charge the capacitance C to the same voltage above ground; this is due to the voltage developed across $R_{eq}$ by the action of the bootstrapping circuit. Consequently the capacitance C looks as if it were smaller than it actually is.

Since the circuit increases the effective value of the load resistance 14 while at the same time it decreases the effective capacitance of the distributed capacitance C, the time constant RC remains substantially the same. Accordingly the very desirable result is obtained that the time constant remains small while the sensitivity or gain can be increased a hundredfold or more. At the same time, since the actual size of the load resistor 14 remains small, the noise caused thereby is also small.

Accordingly it will be seen that it is possible to make the time constant smaller than the actual rise time or fall time of the current flowing through the phototransistor 10. The actual rise time may be of the order of 5 microseconds.

It will be appreciated that the phototransistor 10 may be replaced by any suitable transducer or by a transistor having a base current which is generated by a signal to be amplified. In other words, the current which flows out of the emitter of phototransistor 10 varies in accordance with a signal which need not necessarily be light.

Another way of looking at the circuit of FIG. 1 is to consider it as a voltage gain amplifier. The amplification of the input signal is given by the factor of Equation 5, that is, $\alpha/(1-\alpha)$. Considered as a high gain voltage amplifier the circuit has low output impedance and good stability. It should further be noted that in any case the output impedance of the phototransistor-transistor combination is extremely low because it is the output impedance of an emitter follower.

If desired, the phototransistor 10 may be enclosed by an electrostatic shield. Such an electrostatic shield may also be bootstrapped in the manner previously explained.

In some cases it may be desirable to utilize feedback connections such as 21, 23 and 34, which are directly coupled. Such a circuit lends itself particularly well for the manufacture or a completely integrated circuit. In that case capacitors must be avoided as far as possible. Accordingly the respective feedback capacitors such as 22, 24 and 35 may, for example, be replaced by Zener diodes, because the main purpose of the feedback impedance is to provide a direct voltage potential between the two terminal points of the feedback connections.

Furthermore the circuit of the present invention decreases the sensitivity of the phototransistor 10 to environmental noise which may be capacitively coupled into the phototransistor. This is due to the fact that all the high-impedance terminals of conventional circuits except the base lead of the phototransistor have been changed to very low-impedance terminals. This is caused by the emitter-follower configuration of both the phototransistor 10 and the transistor 11. The output impedance of either transistor 10 or 11 is on the order of the reciprocal of $\alpha$, where $\beta$ is defined as the current gain of the particular transistor. More precisely, $\beta$ is usually defined as the ratio of an incremental collector current change to the resulting incremental base current change with a constant collector voltage.

It will be understood that the circuit specifications of the light-sensitive circuit of FIG. 1 may vary according to the design for any particular application. The following circuit specifications are included by way of example only:

Phototransistor 10—Type L14A502
Transistor 11—Type 2N3643

Resistor:
- 14—5100 ohms
- 15—5100 ohms
- 17—20,000 ohms
- 20—20,000 ohms
- 30—91,000 ohms
- 31—5600 ohms
- 33—24,000 ohms Capacitor:
- 22—1 microfarad
- 24—1 microfarad
- 35—1 microfarad Battery:
- 16—+25 volts
- 18— −25 volts A modified photosensitive circuit in accordance with the present invention is illustrated in FIG. 3. In the first place, the bias network 30, 31, 33 for the base of the phototransistor 10 has been omitted. As previously explained, this bias network is optional. Therefore, the base of phototransistor 10 is floating.

On the other hand, the feedback connection 23 includes the serial combination of the capacitor 25 and a resistor 42. The capacitor-resistor combination 24, 42 may be designed to provide frequency peaking at a desired frequency. In other words, the constants of capacitor 24 and resistor 42 may be selected, for example, by varying the capacitance of capacitor 24 to give a maximum response at a predetermined frequency. This, of course, means that the effective gain of the signal at a lower frequency will be decreased.

Otherwise the circuit of FIG. 3 operates in the same manner as does that of FIG. 1 and a further explanation is not believed to be necessary.

There has thus been disclosed a photosensitive circuit which combines high sensitivity with a very short time constant. The time constant may be made shorter than the normal current rise or fall time of a phototransistor. In addition, it is feasible to provide frequency peaking at a desired frequency range. Thus, the circuit combines very fast response with sensitivity to very low amplitude light scintillations. All this is effeced by proper bootstrapping which simultaneously increases the effective size of the load resistor while decreasing the effective size of the distributed capacitance.

What is claimed is:

1. A circuit permitting a fast response time at minimum signal levels comprising:
- (a) a first light-responsive transistor;
- (b) a second transistor having its base connected to the emitter of said first transistor;
- (c) a first impedance element connected between the emitter of said first transistor and a first point of fixed potential;
- (d) means for biasing said first transistor into operating conditions;

- (e) a feedback connection provided between the emitter of said second transistor and an intermediate point of said first impedance element; and
- (f) means for biasing said second transistor into optimum operating conditions including a second impedance element connected between the emitter of said second transistor and a second point of fixed potential, whereby the effective load impedance of said first transistor represented by the portion of said first impedance element between said feedback connection and said emitter of said first transistor is multiplied by $\alpha/(1-\alpha)$, where $\alpha$ is the voltage gain of said second transistor connected as an emitter follower.

2. A circuit permitting a fast response time at minimum light signal levels comprising:
- (a) a first transistor responsive to variations of the light signal;
- (b) a second transistor having its base connected to the emitter of said first transistor;
- (c) a resistive network connected between the emitter of said first transistor and a first point of fixed potential;
- (d) means for biasing said first transistor into operating conditions;
- (e) a feedback connection provided between the emitter of said second transistor and an intermediate point of said resistive network; and
- (f) means for biasing said second transistor into optimum operating conditions including a resistor connector between the emitter of said second transistor and a second point of fixed potential, whereby the effective load resistance of said first transistor represented by the portion of said resistive network between said feedback connection and said emitter of said first transistor is multiplied by $\alpha/(1-\alpha)$, where $\alpha$ is the voltage gain of said second transistor connected as an emitter follower.

3. A circuit as defined in claim 2 wherein an additional feedback connection is provided between the emitter of said second transistor and the collector of said first transistor, and wherein an additional resistor is connected between the collector of said first transistor and a third point of fixed potential.

4. A light-sensitive circuit permitting a fast response time at minimum light levels comprising:
- (a) a phototransistor;
- (b) a transistor having its base connected to the emitter of said phototransistor;
- (c) a first and a second resistor connected serially between the emitter of said phototransistor and a first point of fixed potential;
- (d) means for biasing said phototransistor into operating conditions including a third resistor connected between the collector of said phototransistor and a second point of fixed potential;
- (e) a first feedback connection provided between the emitter of said transistor and the collector of said phototransistor;
- (f) a second feedback connection provided between the emitter of said transistor and the junction point of said first and second resistors; and
- (g) means for biasing said transistor into optimum operating conditions including a fourth resistor connected between the emitter of said transistor and a third point of fixed potential, whereby the effective load resistance of said phototransistor represented by said first resistor is multiplied by $\alpha/(1-\alpha)$, where $\alpha$ is the voltage gain of said transistor connected as an emitter follower and whereby the time constant of said circuit may be made small compared to the current rise and fall times of said phototransistor.

5. A light-sensitive circuit as defined in claim 4 wherein said first feedback connection includes a capacitor.

6. A light-sensitive circuit as defined in claim 4 wherein said second feedback connection includes a capacitor.

7. A light-sensitive circuit as defined in claim 6 wherein an additional resistor is connected in series with said capacitor for providing an enhanced high-frequency response.

8. A light-sensitive circuit as defined in claim 4 wherein a resistive network is connected between said first and second points of fixed potential and the base of said phototransistor, thereby to increase the sensitivity of said phototransistor.

9. A light-sensitive circuit as defined in claim 4 wherein a fifth and a sixth resistor are connected serially between said first and second points of fixed potential, and wherein a seventh resistor is connected between the junction point of said fifth and sixth resistors and the base of said phototransistor, thereby to improve the sensitivity of said phototransistor.

10. A light-sensitive circuit as defined in claim 9 wherein an additional feedback connection is provided between the emitter of said transistor and the junction point of said fifth and sixth resistors.

11. A light-sensitive circuit as defined in claim 10 wherein said additional feedback connection includes a capacitor.

12. A light-sensitive circuit permitting a fast response time at low light levels comprising:

(a) a phototransistor of the n-p-n type;

(b) a transistor of the n-p-n type having its base connected to the emitter of said phototransistor;

(c) a first and a second resistor connected serially between the emitter of said phototransistor and ground;

(d) means for biasing said phototransistor into operating conditions including a third resistor connected between the collector of said phototransistor and a point of positive potential;

(e) a first feedback connection including a first capacitor connected between the emitter of said transistor and the collector of said phototransistor;

(f) a second feedback connection including a second capacitor and a fourth resistor connected serially between the emitter of said transistor and the junction point of said first and second resistors, thereby to enhance the high-frequency response of the circuit; and (g) means for biasing said transistor into optimum operating conditions including a fifth resistor connected between the emitter of said transistor and a point of negative potential, whereby the effective load resistance of said phototransistor is bootstrapped to make it appear substantially larger than its actual size determined by the gain of the transistor connected as an emitter follower, while the time constant of said circuit remains small in spite of the bootstrapping caused by said feedback connections.

References Cited

UNITED STATES PATENTS

| | | | |
|---|---|---|---|
| 2,469,852 | 5/1949 | Strutt et al. | 250—214 |
| 2,945,131 | 7/1960 | Astheimer | 250—214 |
| 2,948,815 | 8/1960 | Willems et al. | 250—211 |

WALTER STOLWEIN, Primary Examiner

T. N. GRIGSBY, Assistant Examiner

U.S. Cl. X.R.

250—214